United States Patent
Bodnar

(10) Patent No.: US 7,542,365 B2
(45) Date of Patent: Jun. 2, 2009

(54) APPARATUS AND METHOD FOR ACCESSING A SYNCHRONOUS SERIAL MEMORY HAVING UNKNOWN ADDRESS BIT FIELD SIZE

(75) Inventor: John W. Bodnar, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 69 days.

(21) Appl. No.: 11/862,856

(22) Filed: Sep. 27, 2007

(65) Prior Publication Data

US 2009/0089530 A1    Apr. 2, 2009

(51) Int. Cl.
*G11C 7/00* (2006.01)
(52) U.S. Cl. .................. 365/221; 365/233.5; 365/233.1; 365/238.5
(58) Field of Classification Search .................. 365/221, 365/233.5, 238.5, 233.1, 233.11, 189.17, 365/189.15
See application file for complete search history.

(56) References Cited

U.S. PATENT DOCUMENTS

| | | | |
|---|---|---|---|
| 6,535,514 | B1 | 3/2003 | Gordon et al. |
| 6,778,454 | B2 * | 8/2004 | Duh et al. .................. 365/221 |
| 7,047,350 | B2 | 5/2006 | Elledge et al. |
| 7,206,914 | B1 | 4/2007 | Wisor |
| 7,206,928 | B2 | 4/2007 | Chang |
| 2004/0250056 | A1 | 12/2004 | Chang |
| 2005/0180206 | A1 | 8/2005 | Randell et al. |
| 2005/0283598 | A1 | 12/2005 | Gaskins et al. |
| 2007/0079024 | A1 | 4/2007 | Wayner |

OTHER PUBLICATIONS

AMCC User's Manual for PPC405EP Embedded Processor; Document Issue 1.01, Sep. 2004, pp. 9-1 thru 9-6.
Texas Instruments reference Guide for TMS320x281xDSP Boot Rom; Literature No. SPRU095B, May 2003-Nov. 2004, pp. 43-47.
NetSilicon Reference Manual for Digi Connectware NS9750 Hardware; Part Number Version 90000624_C, Dec. 2004, pp. 490-495.

* cited by examiner

*Primary Examiner*—David Lam
(74) *Attorney, Agent, or Firm*—Daniel D. Hill

(57) ABSTRACT

An apparatus and method are provided for accessing a serial memory without knowing the required number of address bits. The apparatus comprises a pull circuit, a data out control circuit and a transition detector. The pull circuit causes the input terminal to be set to a first predetermined logic state in response to a read command being provided to the serial memory. The data out control circuit has an output terminal for providing the read command and a first predetermined number of address bits to the output terminal. The transition detector is coupled to an input terminal for detecting if the input terminal transitions from the first predetermined logic state to a second predetermined logic state in response to the first predetermined number of address bits. The transition detector will detect a transition of the input terminal when a correct number of address bits have been provided.

20 Claims, 4 Drawing Sheets

US 7,542,365 B2

APPARATUS AND METHOD FOR ACCESSING A SYNCHRONOUS SERIAL MEMORY HAVING UNKNOWN ADDRESS BIT FIELD SIZE

BACKGROUND

1. Field

This disclosure relates generally to integrated circuits, and more specifically, to an apparatus and method for accessing a synchronous serial memory without knowing the size of the address bit field.

2. Related Art

Data processing systems can be found in many of today's electronic devices. Applications are wide ranging and include automotive, wireless, home appliances, etc. A typical data processing system includes a microprocessor that functions as a central processing unit (CPU). Most microprocessors (MPUs) and microcontrollers (MCUs) require "boot" code upon startup. Boot code is the software first accessed by the microprocessor to provide the initial instructions to start operating. Typically, boot code is stored in one of many types of nonvolatile memory. One type of nonvolatile memory used to store boot code is a synchronous serial memory.

Today, synchronous serial memories vary in size (number of bits or density) from 1 kilo bit (Kbit) up to 128 mega bits (Mbits). A different number of address bytes are required to access the synchronous serial memory depending on the memory's size. Generally, the number of address bytes increases as the memory density increases. For example, memory devices with densities from 1 to 4 Kbits, inclusive, require a single address byte (8 bits), and memory devices with densities from 8 to 256 Kbits require two address bytes. Therefore, when a read command is issued to the synchronous serial memory, the data processing system must "know" how many address bytes to provide. This variability in the number of address bytes makes it more difficult to, for example, upgrade a data processing system with a larger boot memory because the state machine and instructions used to access the memory must also be changed to account for the different number of address bytes.

One solution to the problem is to provide memory size information to the microprocessor using an additional pin or pins on the microprocessor. This would be a less than optimal use of such an additional pin as the memory is only accessed when the microprocessor is booted.

Another solution requires that the read opcode from the processor have as many bytes as the largest memory size supported. Smaller memories can use the larger number of address bytes if the initial data stored in the memory is zero-padded. However, this solution will not work for memories larger than the largest memory size supported.

Therefore, it would be desirable to have a system and method that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
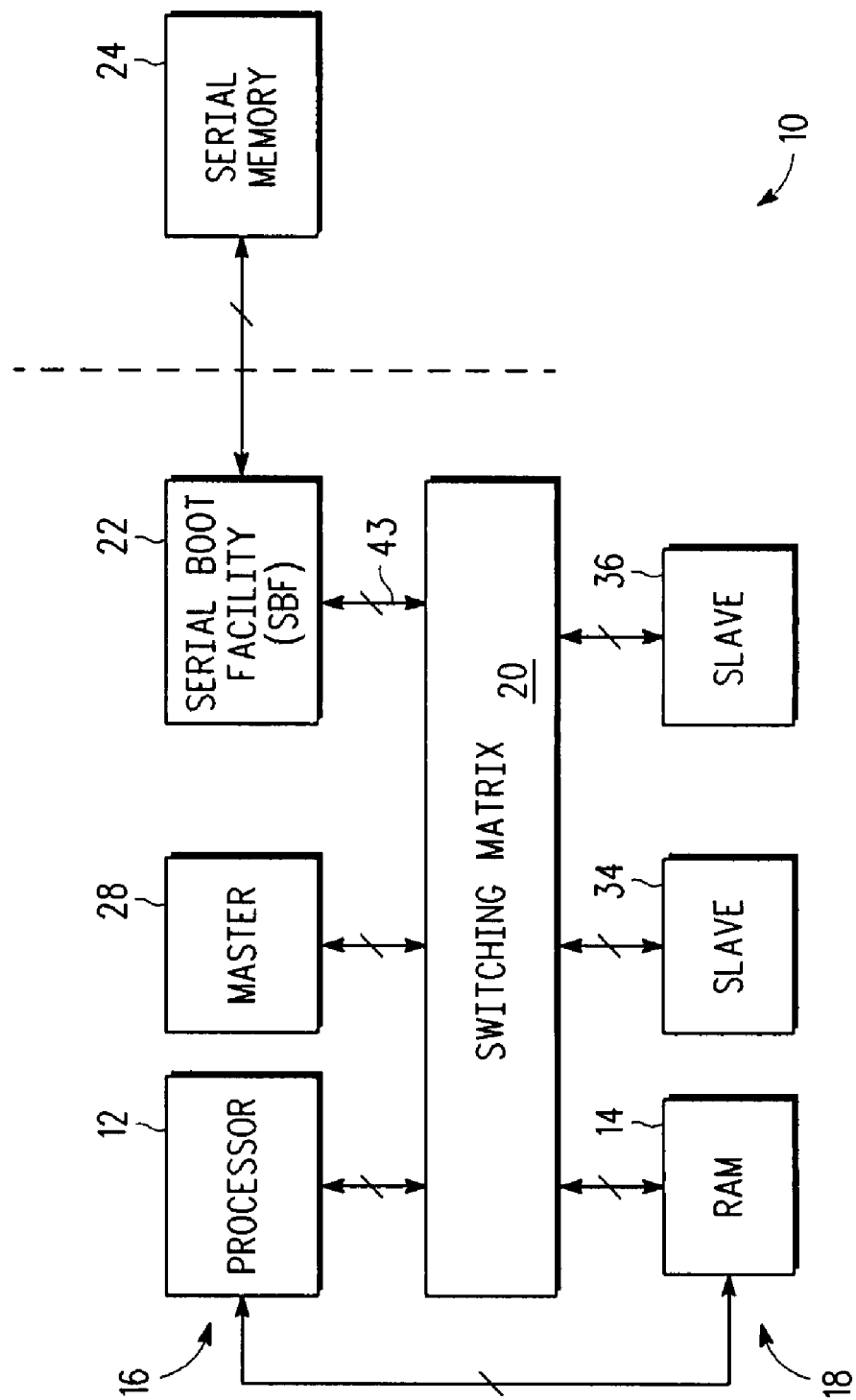
FIG. 1 illustrates, in block diagram form, an integrated circuit and serial memory in accordance with an embodiment.

Generally, there is provided, an integrated circuit having a serial boot facility (SBF) for causing boot code to be read from a synchronous serial memory without knowing the size of the memory or how many address bytes are required to access the memory. The SBF includes a pull circuit, a data out control circuit, and a transition detector. The pull circuit is coupled to a serial data output terminal of the serial memory (or the serial input terminal of the integrated circuit). The pull circuit causes the output terminal to be pulled to a first predetermined logic state in response to a read command being provided to access the serial memory. The data out control circuit then causes a first predetermined number of address bits to be provided to the serial memory. The transition detector detects if the output terminal transitions from the first predetermined logic state to a second predetermined logic state in response to the first predetermined number of address bits. If the transition detector detects a transition of the output terminal of the serial memory, then the first predetermined number of address bits is a correct number of address bits for accessing the memory. If the transition detector does not detect a transition of the input terminal, then additional address bits are provided to the serial memory until a transition is detected. The described SBF allows a processor to access a serial memory without knowing how many address bits are required. This allows a different size serial memory to be coupled to a processor without any changes to the processor. In addition, the SBF determines the data rate of the serial memory and adapts a clock signal used to shift data out of the serial memory for optimum performance.

In one aspect there is provided, an apparatus comprising: an input terminal for receiving data bits from a serial memory; an output terminal for providing command and address bits to the serial memory; a pull circuit for causing the input terminal to be set to a first predetermined logic state in response to a read command being provided to the serial memory; a data out control circuit, coupled to the output terminal, for causing the read command to be provided and for causing a first predetermined number of address bits to be provided to the output terminal; and a transition detector, coupled to the input terminal, for detecting if the input terminal transitions from the first predetermined logic state to a second predetermined logic state in response to the first predetermined number of address bits; wherein if the transition detector detects a transition of the input terminal, indicating that the first predetermined number of address bits is a correct number of address bits to access the memory, then receiving the data bits at the input terminal; and wherein if the transition detector does not detect a transition of the input terminal, indicating that the first predetermined number of address bits is insufficient for accessing the memory, then providing a second predetermined number of address bits to the output terminal. In one embodiment, the pull circuit comprises a pull-up circuit having a first terminal coupled to a power supply voltage terminal, a second terminal for receiving an enable signal, and a third terminal coupled to the input terminal. The serial memory may be implemented as a standalone monolithic integrated circuit. Additionally, the apparatus may include: a clock generator for providing a clock signal to the serial memory in response to receiving a system clock signal; and a divider table, coupled to the clock generator, the divider table comprising a plurality of dividers for reducing a clock rate of the clock signal to substantially match a desired or maximum data rate at which the serial memory can transmit data. A processor may be coupled to the SBF, wherein the serial memory is for storing boot code and data for the processor. The serial memory comprises memory cells selected from a group consisting of flash memory cells, electrically erasable programmable read only memory (EEPROM) cells, ferroelectric read only random access memory (FRAM) cells, or magnetoresistive random access memory (MRAM) cells, or other suitable type of non-volatile memory (NVM) cells.

In another aspect there is provided, an apparatus comprising: an input terminal for receiving data bits from a serial memory; an output terminal for providing command and address bits to the serial memory; a processor; a serial boot facility, coupled to the processor, the serial boot facility for reading boot code and data from the serial memory in response to a reset of the processor, the serial boot facility comprising: a pull circuit for causing the input terminal to be set to a first predetermined logic state in response to a read command being provided to the serial memory; a data out control circuit, coupled to the output terminal, for causing the read command to be provided and for causing a first predetermined number of address bits to be provided to the output terminal; and a transition detector, coupled to the input terminal, for detecting if the input terminal transitions from the first predetermined logic state to a second predetermined logic state in response to the first predetermined number of address bits; wherein if the transition detector detects a transition of the input terminal, indicating that the first predetermined number of address bits is a correct number of address bits to access the memory, then receiving the data bits at the input terminal; and wherein if the transition detector does not detect a transition of the input terminal, indicating that the first predetermined number of address bits is insufficient for accessing the memory, then providing a second predetermined number of address bits to the output terminal. The pull circuit comprises a pull-up circuit having a first terminal coupled to a power supply voltage terminal, a second terminal for receiving a control signal, and a third terminal coupled to the input terminal. The serial memory may be implemented as a standalone monolithic integrated circuit. The integrated circuit may also include: a clock generator for providing a clock signal to the serial memory in response to receiving a system clock signal; and a divider table, coupled to the clock generator, the divider table comprising a plurality of dividers for reducing a clock rate of the clock signal to substantially match a desired or maximum data rate at which the serial memory can transmit data. The serial memory may be characterized as being a serial flash memory. A random access memory may be coupled to the processor for receiving the boot code and data read from the serial memory. Further, the first and second predetermined number of address bits may be part of a continuous stream of address bits provided to the output terminal until the transition detector detects a transition on the input terminal.

In yet another aspect there is provided, a method for accessing a serial memory comprising: providing a command to access the serial memory; setting an output terminal of the serial memory to a first predetermined logic state using a pull circuit; providing a first predetermined number of address bits to the serial memory; monitoring the output terminal to detect when the output terminal transitions from the first predetermined logic state to a second predetermined logic state, and if a transition is detected, indicating that the first predetermined number of address bits is a correct number of address bits for accessing the serial memory, receiving a predetermined number of data bits from the serial memory, and if a transition is not detected, indicating that the serial memory has not received a correct number of address bits, iteratively providing address bits until a transition is detected. The first predetermined number of address bits may comprise a one byte address. Also, setting an output of the serial memory to a first predetermined logic state may further comprise pulling the output terminal to a logic high state using a pull-up circuit. The method may further comprise: disabling the pull circuit; providing a predetermined number of clock edges to the serial memory; receiving a predetermined number of consecutive data bits from the serial memory; determining that all of the predetermined number of data bits have a same logic state; and reading data from the serial memory. In addition, the method may further comprise: determining an output data rate of the serial memory; and setting a clock rate of an input clock signal provided to the serial memory to substantially match the desired or maximum output data rate. The method may further comprise setting the clock rate by dividing a system clock rate by a divider selected from a plurality of dividers. The serial memory may be accessed to provide boot code and data to a processor.

FIG. 1 illustrates, in block diagram form, an integrated circuit 10 and serial memory 24 in accordance with an embodiment. In one form, integrated circuit 10 includes master devices 16, slave devices 18, and switching matrix 20. Master devices 16 includes processor 12, master device 28, and SBF 22, each bi-directionally coupled to switching matrix 20. Switching matrix 20 may also be known as a "crossbar switch". Slave devices 18 includes RAM 14, slave device 34, and slave device 36, each bi-directionally coupled to switching matrix 20. Note that there may be any number of master devices and slave devices on integrated circuit 10. Switching matrix 20 allows any of master devices 16 to communicate with any of slave serial devices 18, however, master devices do not directly communicate with each other in the illustrated embodiment. Also, switching matrix 20 incorporates functionality to arbitrate where necessary. Multiple communication paths between the various devices can exist simultaneously.

Processor 12 includes a microprocessor core and functions as a central processing unit (CPU) for integrated circuit 10. Note that there may be any number of processors coupled to switching matrix 20. Also, note that the specific architecture of integrated circuit 10 is not important for describing the invention and may be different in other embodiments. For example, one or more processors and one or more functional modules including SBF 22 may be connected together with a system bus. An arbiter may be included to arbitrate use of the system bus. Also in other embodiments, the data processing system of integrated circuit 10 may be implemented using more than one integrated circuit.

Slave devices 18 may include various device types. Example devices include various communications devices, memories, audio devices, timing devices, mixed signal devices, and external memory interface devices. Note that RAM 14 is also bi-directionally coupled to processor 12 to provide direct access to RAM 14 by processor 12.

Serial boot facility (SBF) 22 is bi-directionally coupled to switching matrix 20 via a plurality of conductors 43. SBF 22 functions primarily to read chip initialization data and boot code (herein after referred to as "boot data") from serial memory 24 for use by processor 12 upon reset. Various types of synchronous serial memory are commercially available. In the illustrated embodiment, serial memory 24 is a command driven serial memory having flash type memory cells. In other embodiments, serial memory 24 may include electrically erasable programmable read only memory (EEPROM), flash, ferroelectric random access memory (FRAM), and magnetoresistive random access memory (MRAM). Also, serial memory 24 is preferably implemented separate from integrated circuit 10 on a single monolithic integrated circuit as indicated by the vertical dashed line between SBF 22 and serial memory 24 in FIG. 1. In response to a read command issued by SBF 22, boot data is provided to RAM 14 via SBF 22. Processor 12 executes the boot code directly from RAM 14.

A read command includes the read command opcode followed by one or more address bytes. The number of address bytes used to access serial memory 24 depends on the size, or density, of serial memory 24. In accordance with the illustrated embodiment, SBF 22 reads data from serial memory 24 without being preprogrammed with the memory size so the number address bytes required to access memory 24 does not have to be known by SBF 22. This is accomplished by shifting in an address byte-by-byte until data is detected at an output terminal of the serial memory. This allows different serial memories having different densities or addressing requirements to be easily coupled to integrated circuit 10 without having to make changes to SBF 22. For example, a different serial memory having a different size may be necessary to accommodate more boot code. SBF 22 is not limited to serial memories below a certain size or to a range of sizes, but is extendable indefinitely as memory sizes increase. Also, SBF 22 automatically determines the data rate of serial memory 24 and adjusts a shift clock rate to optimize data transfer. Serial boot facility 22 will be discussed in more detail below.

Figure 2:
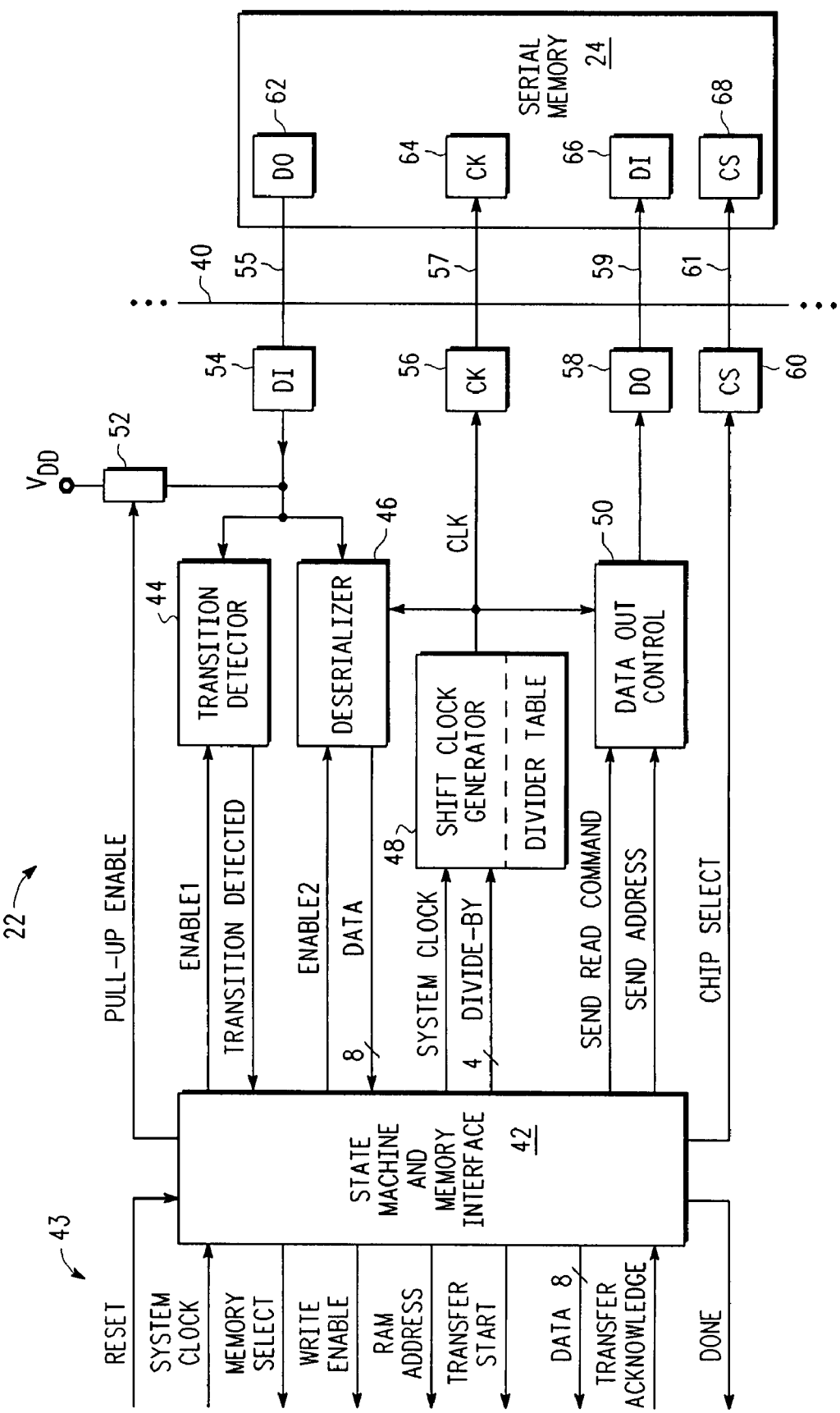
FIG. 2 illustrates, in block diagram form, a serial boot facility (SBF) of the integrated circuit of FIG. 1.

FIG. 2 illustrates, in block diagram form, SBF 22 of integrated circuit 10 in more detail. SBF 22 includes state machine and memory interface 42, transition detector 44, deserializer 46, shift clock generator 48, data out control 50, pull-up device 52, and terminals 54, 56, 58, and 60. For example, in the illustrated embodiment, state machine and memory interface 42 has an input terminal for receiving a reset signal labeled "RESET", an input terminal for receiving a clock signal labeled "SYSTEM CLOCK", an output terminal for providing a select signal labeled "MEMORY SELECT", an output terminal for providing a write enable signal labeled "WRITE ENABLE", an output terminal for providing address signals labeled "RAM ADDRESS", an output terminal for providing a start signal labeled "START TRANSFER", 8 terminals (or some multiple of 8) for providing a byte of data in parallel labeled "DATA", an input terminal for receiving an acknowledge signal labeled "TRANSFER ACKNOWLEDGE", and a signal labeled "DONE". The TRANSFER ACKNOWLEDGE signal indicates a transfer is complete. The DONE signal is an output from SBF 22 that indicates when reading from serial memory 24 is done and that processing may continue as normal. Data is read from serial memory 24 byte-by-byte; however the bytes may be grouped for efficiency. For example, the data may be transferred in groups of bytes. The number of bytes in a group depends, in part, on processor architecture. Note that in other embodiments, there may be more or fewer conductors between SBF 24 and switching matrix 20.

A pull device 52 has a first terminal coupled to a power supply voltage terminal labeled "VDD", a second terminal for receiving an enable signal labeled "PULL-UP ENABLE", and a third terminal coupled to input terminal 54. In the illustrated embodiment, VDD receives a positive power supply voltage and functions to pull up a voltage at terminal 54 to be equal to approximately VDD. Pull device 52 may comprise, for example, a P-channel MOSFET (metal oxide semiconductor field effect transistor) having a first current electrode coupled to VDD, a control electrode for receiving enable signal PULL-UP ENABLE, and a second current electrode coupled to terminal 54. Pull device 52 should be implemented as a relatively weak pull-up device such that a logic low voltage from serial memory 24 can pull down the voltage at terminal 54 against the pull of pull-up device 52. In other embodiments, it may be desirable to initially pull down a voltage at terminal 54 to, for example, ground potential using a pull-down device. In those embodiments, a pull-down device may comprise, for example, an N-channel MOSFET having a first current electrode coupled to ground, a control electrode for receiving a pull-down control signal, and a second current electrode coupled to terminal 54.

Transition detector 44 has an input terminal coupled to state machine and memory interface 42 for receiving an enable signal labeled "ENABLE1", an output terminal for providing a signal labeled "TRANSITION DETECTED" to state machine and memory interface 42, and an input terminal coupled to terminal 54 for receiving a data in signal from serial memory 24. Deserializer 46 has an input terminal coupled to state machine and memory interface 42 for receiving an enable signal labeled "ENABLE2", a plurality of output terminals coupled to state machine and memory interface 42 for providing data signals labeled "DATA", an input terminal coupled to terminal 54, and an input terminal for receiving a shift clock signal labeled "CLK". Shift clock generator 48 has an input terminal coupled to state machine and memory interface 42 for receiving a clock signal labeled "SYSTEM CLOCK", an input terminal coupled to state machine and memory interface 42 for receiving signals labeled "DIVIDE_BY", and an output terminal for providing shift clock signal CLK. Data out control circuit 50 has an input terminal for receiving a control signal labeled "SEND READ COMMAND", an input terminal for receiving a control signal labeled "SEND ADDRESS", an input terminal for receiving clock signal CLK, and an output terminal coupled to terminal 58.

As illustrated in FIG. 2, serial memory 24 is implemented as a separate monolithic integrated circuit from integrated circuit 10. An edge of integrated circuit 10 is depicted in FIG. 2 as vertical line 40. Serial memory 24 has four terminals, or pins 62, 64, 66, and 68, for communicating with integrated circuit 10. Data input terminal 54 of SBF 22 is coupled to data output terminal 62 of serial memory 24 via a conductor 55 to receive data signals from serial memory 24. The data signals are provided to both transition detector 44 and deserializer 46. Clock terminal 56 is coupled to clock terminal 64 of serial memory 24 via conductor 57 for providing shift clock signal CLK from shift clock generator 48 to serial memory 24. Data output terminal 58 is coupled to data input terminal 66 via a conductor 59 to provide data signals from data out control 50 to serial memory 24. Chip select terminal 60 is coupled to state machine and memory interface 42 for receiving CHIP SELECT signal. Chip select terminal 60 is also coupled to chip select terminal 68 via a conductor 61. Note that serial memory 24 has four terminals. The conductors 55, 57, 59, and 61 may be traces or wires on a printed circuit board (PCB) to which integrated circuit 10 and serial memory 24 are attached. In other embodiments, the integrated circuit 10 and serial memory 24 may be separate die of a multiple die package, or some other type of die mounting structure. Also, in other embodiments, serial memory 24 may have more or fewer terminals than four.

Generally, SBF 22 controls the transfer of initialization data and boot code from serial memory 24 to RAM 14 (FIG. 1). State machine and memory interface 42 functions as a control circuit to control the operation of SBF 22 as well as the transfer of data from serial memory 24 to RAM 14. A transfer begins when state machine and memory interface 42 receives a reset signal RESET and clock signal SYSTEM CLOCK. The reset signal may be asserted at startup of integrated circuit 10 in response to a power supply voltage (VDD) being applied to integrated circuit 10. In this case, after VDD stabilizes, signal CHIP SELECT and enable signal PULL-UP ENABLE are asserted by state machine and memory interface 42. The signal CHIP SELECT enables serial memory 24 and the enable signal PULL-UP ENABLE causes pull device 52 to pull-up the voltage on input terminal 54. Enable signal ENABLE1 is asserted to enable transition detector 44. Transition detector 44 will monitor the voltage at input terminal 54 and assert signal TRANSITION DETECTED in response to detecting a logic high to logic low. As discussed above, a pull-down device may be substituted for pull-up device 52 in other embodiments where the initial data bits from serial memory 24 are expected to be "ones". State machine and memory interface 42 will assert enable signal ENABLE2 to enable deserializer 46 to convert the stream of data bits from serial memory 24 to parallel form. In the illustrated embodiments, deserializer 46 provides a byte (8 bits) in parallel for each byte received from serial memory 24. Clock signal CLK is provided to serial memory 24 in response to receiving clock signal SYSTEM CLOCK. Control signal SEND READ COMMAND is then provided to data out control 50. Data out control 50 will send a read command to data out terminal 58. The read command is communicated to serial memory 24 via conductor 59 to data input terminal 66. After the read command is sent, state machine and memory interface 42 will provide signal SEND ADDRESS to data out control 50. Data out control 50 will begin to clock address bytes serially to data out terminal 58 in response to clock signal CLK. Serial memory 24 will begin to provide data bits a byte at a time at data out terminal 62 when serial memory 24 has received the correct number of address bytes. The correct number of address bytes depends, at least in part, on the size of serial memory 24. For example, if serial memory 24 has a density, or size, of from 1 to 4 Kbits, then serial memory 24 will require one address byte. If serial memory 24 has from 8 to 256 Kbits of storage bits, then serial memory 24 will require two address bytes. Depending on whether the underlying memory technology is EEPROM (electrically erasable programmable read only memory) or flash, 512 Kbits of storage will require 2 or 3 address bytes, respectively. If serial memory 24 is from 1 to 128 Mbits in size, 3 address bytes are required. Currently, serial memories with 128 Mbits are the largest available. If larger memories become available, then presumably 4 address bytes and higher will be required.

When serial memory 24 receives the correct number of address bytes, serial memory 24 will begin to provide data bits to data out terminal 62. In the illustrated embodiment, the first byte of data accessed by the first address comprises some predetermined number of bits of the same logic state, for example, four bits of the first byte will be logic "zeros". This is done to provide a de-glitching capability for serial memory 24. The output data is provided to transition detector 44 and deserializer 46. When transition detector 44 detects the first zero bit from serial memory 24, transition detector 44 will provide control signal TRANSITION DETECTED to state machine and memory interface 42. State machine and memory interface 42 will de-assert signal PULL_UP ENABLE to disable pull device 52. Data will be clocked into deserializer 46 on rising edges of clock signal CLK. The initial clock rate of clock signal CLK will be the system clock frequency divided by some value suitable to cause clock signal clock to have an initial clock rate of about 1 mega hertz (MHz). Typically, serial memories using EEPROM technology can provide data at a maximum clock rate of 1 to 10 MHz. Flash type serial memories can provide data at a maximum clock rate of about 20 to 33 MHz using the standard READ command and 40 to 100 MHz using the FAST_READ command. Ferroelectric random access memory (FRAM) based serial memories can have a maximum clock rate of about 25 MHz. State machine and memory interface 42 determines the clock rate of data being provided by serial memory 24 and selects a divider from a divider table, via the four bit DIVIDE_BY signal, in shift clock generator to be applied to clock signal SYSTEM CLOCK to divide SYSTEM CLOCK down to an optimum frequency and provide the divided clock as clock signal CLK. The divider table in shift clock generator 48 includes, for example, dividers 1, 2, 3, 4, 5, 9, 13, 14, 17, 25, 33, 34, 50 and 67. In other embodiments, the divider table may have different divider values depending on the frequency of clock signal SYSTEM CLOCK.

To provide the boot data from serial memory 24 to RAM 14, state machine and memory interface 42 provides signals MEMORY SELECT, WRITE ENABLE, RAM ADDRESS and TRANSFER START. RAM 14 will send signal TRANSFER ACKNOWLEDGE. Data bits DATA are provided on a 32 bit bus to RAM 14 in 4 byte groups. In other embodiments, a group can include any number of bytes. As discussed above, the data will be transferred from SBF 22, through switching matrix 20 to RAM 14. When the transfer is complete, state machine and memory interface 42 will send signal DONE to the rest of the system to indicate normal operation can proceed.

Figure 3:
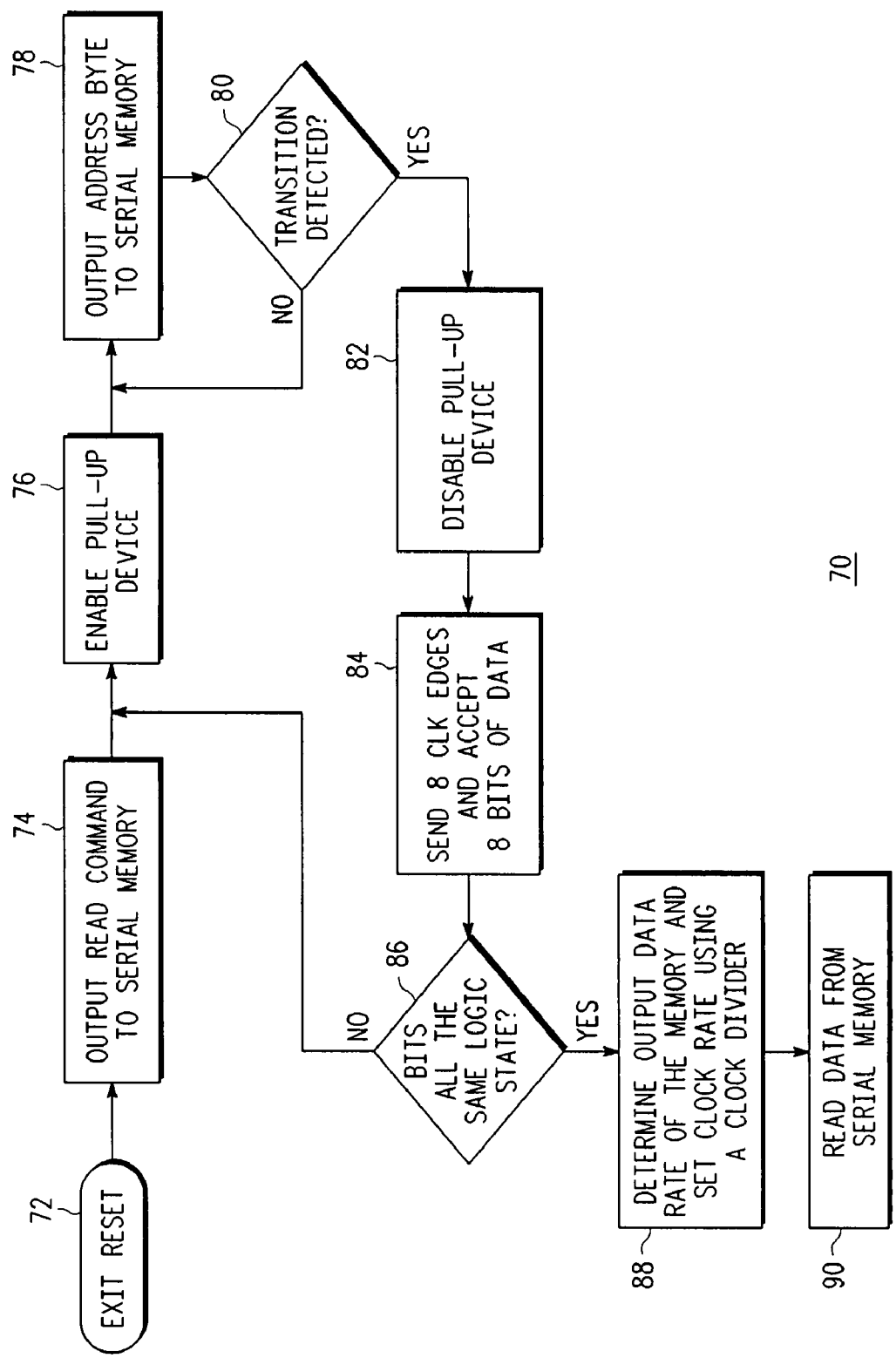
FIG. 3 illustrates a flow chart of steps to read a serial memory without knowing the memory density.

FIG. 3 illustrates a flow chart of steps to read a serial memory without knowing the serial memory density. When integrated circuit 10 is powered up a reset signal is asserted internally to establish initial conditions in certain register files and internal nodes in, for example, processor 12. After the initial conditions are established, the reset state is exited as shown at step 72. Boot data that are needed to begin a boot up process are provided by serial memory 24. To begin transferring the boot data from serial memory 24, a read command is output from SBF 22 to serial memory 24 as shown at step 74. Pull device 52 is enabled at step 76 to set a data input terminal 54 of SBF 22 to a known logic state. As discussed above, the pull device 52 is a pull-up device in the illustrated embodiment. At step 78, SBF 22 provides an address byte to serial memory 24. At decision step 80, it is determined if a transition is detected at data input terminal 54. If no transition is detected, then the NO path is taken back to step 78 and another address byte is provided to serial memory 24. This continues until a transition is detected, indicating that the correct number of address bytes have been provided and the YES path is taken to step 82. At step 82, the pull device 52 is disabled. Then, at step 84, eight clock edges of clock signal CLK are provided to and accepted by serial memory 24. Serial memory 24 outputs 8 bits of data in response to the 8 clock edges. A predetermined number of the first 8 consecutive bits of data all have the same logic state and in the illustrated embodiment are logic zeros. The remaining bits in the first byte are used to select a clock divider from a divider table as discussed above. At decision step 86, it is determined if all of the bits are the same logic state. If not then it is assumed there was a problem such as a glitch and the NO path is taken to step 76 and the method is begun again at that point. If the bits are all the same logic state then the YES path is taken to step 88. At step 88, the output data rate is determined and the clock rate of clock signal CLK is set by dividing system clock SYSTEM CLOCK by a clock divider. In the illustrated embodiment, four bits are used to adjust the output data rate. At step 90, the data is read from serial memory 24.

Figure 4:
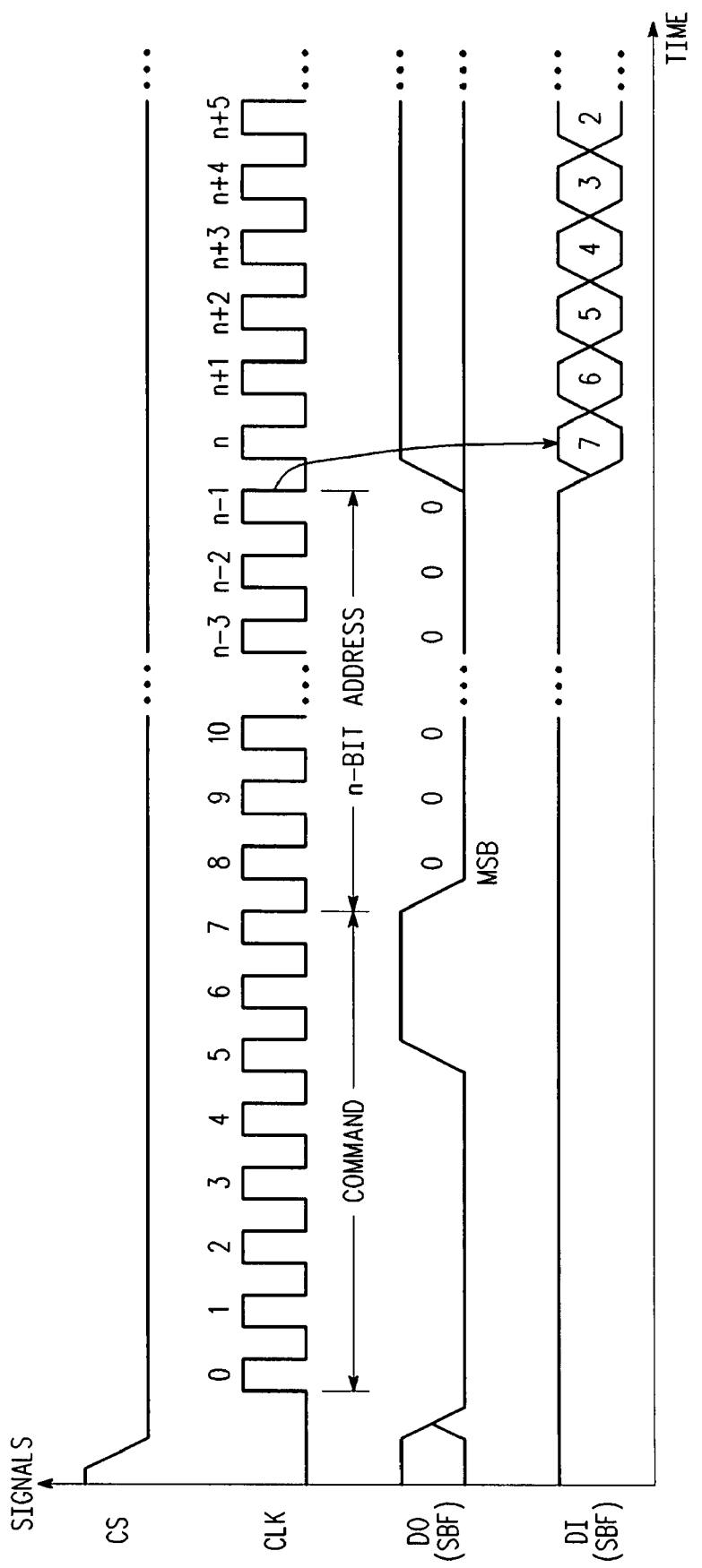
FIG. 4 illustrates a timing diagram of various signals of the SBF of FIG. 2 that is useful for understanding the embodiment.

FIG. 4 illustrates a timing diagram of various signals of the SBF of FIG. 2 that is useful for understanding the embodiment. The signals in FIG. 4 are as seen by terminals of SBF 22 of FIG. 2. The data in terminal 54 of SBF 22 is a logic high in response to a reset signal being provided to state machine and memory interface 42. Chip select signal CS is asserted as a logic low at chip select terminal 60. The asserted signal CS enables serial memory 24. A read command is clocked into serial memory 24 at output data terminal 58 (DO) and requires one byte as illustrated by clock signal CLK. The read command is a predetermined pattern of logic zeros and ones. The byte sent for the read command (COMMAND) is shown in FIG. 4 as binary 00000011 (decimal 3), as this is currently used by the synchronous serial memory industry as the READ command. However, in other embodiments, the read command can be any number. Currently, flash serial memories support two such read commands: the normal READ (which is slower and uses the binary opcode 00000011) and the FAST_READ (which is faster and uses the binary opcode 00001011). SBF 22 supports both read commands. The normal READ command is used on cold boot (power-on) and the FAST_READ command, if desired, on warm boot (a system reset other than power-on). The read command is followed by one or more address bytes as discussed above. In this case, the address bytes contain all zeros. When the correct number of address bytes have been provided, data bits are provided at data in terminal (DI) of SBF 22. In the illustrated embodiment, the first byte of data is dummy data used to de-glitch serial memory 24 and to determine the data rate of serial memory 24 in accordance with the above described embodiment.

By now it should be appreciated that there has been provided an integrated circuit having a serial boot facility (SBF) for causing boot data to be read from a synchronous serial memory without knowing the size of the memory or how many address bytes are required to access the memory. The SBF includes a pull circuit, a data out control circuit, and a transition detector. The pull circuit is coupled to a serial data output terminal of the serial memory (or the serial input terminal of the integrated circuit). The pull circuit causes the output terminal to be pulled to a first predetermined logic state in response to a read command being provided to access the serial memory. The state machine and memory interface 42 then causes a first predetermined number of address bits to be provided to the serial memory. The transition detector detects if the output terminal transitions from the first predetermined logic state to a second predetermined logic state in response to the first predetermined number of address bits. If the transition detector detects a transition of the output terminal of the serial memory, then the first predetermined number of address bits is a correct number of address bits for accessing the memory. If the transition detector does not detect a transition of the input terminal, then additional address bits are provided to the serial memory until a transition is detected. The described SBF allows a processor to access a serial memory without knowing the number of address bits that are required. This allows a different size serial memory to be coupled to a processor without any changes to the processor. In addition, the SBF determines the data rate of the serial memory and adapts a clock signal used to shift data out of the serial memory for optimum performance.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Moreover, the terms "front," "back," "top," "bottom," "over," "under", "up", "down" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The term "coupled," as used herein, is not intended to be limited to a direct coupling or a mechanical coupling.

What is claimed is:

1. An apparatus comprising:
   an input terminal for receiving data bits from a serial memory;
   an output terminal for providing command and address bits to the serial memory;
   a pull circuit for causing the input terminal to be set to a first predetermined logic state in response to a read command being provided to the serial memory;
   a data out control circuit coupled to the output terminal, for causing the read command to be provided and for causing a first predetermined number of address bits to be provided to the output terminal; and
   a transition detector, coupled to the input terminal, for detecting if the input terminal transitions from the first predetermined logic state to a second predetermined logic state in response to the first predetermined number of address bits;
   wherein if the transition detector detects a transition of the input terminal, indicating that the first predetermined number of address bits is a correct number of address bits to access the memory, then receiving the data bits at the input terminal; and
   wherein if the transition detector does not detect a transition of the input terminal, indicating that the first predetermined number of address bits is insufficient for accessing the memory, then providing a second predetermined number of address bits to the output terminal.

2. The apparatus of claim 1, wherein the pull circuit comprises a pull-up circuit having a first terminal coupled to a power supply voltage terminal, a second terminal for receiving an enable signal, and a third terminal coupled to the input terminal.

3. The apparatus of claim 1, wherein the serial memory is implemented as a standalone monolithic integrated circuit.

4. The apparatus of claim 1, further comprising:
a clock generator for providing a clock signal to the serial memory in response to receiving a system clock signal; and
a divider table, coupled to the clock generator, the divider table comprising a plurality of dividers for reducing a clock rate of the clock signal to substantially match a data rate at which the serial memory can transmit data bits.

5. The apparatus of claim 1, further comprising a processor coupled to the apparatus, wherein the serial memory is for storing boot data for the processor.

6. The apparatus of claim 1, wherein the serial memory comprises memory cells selected from a group consisting of flash, electrically erasable programmable read only memory (EEPROM), ferroelectric random access memory (FRAM), or magnetoresistive random access memory (MRAM) cells.

7. An apparatus comprising:
an input terminal for receiving data bits from a serial memory;
an output terminal for providing address bits to the serial memory;
a processor;
a serial boot facility, coupled to the processor, the serial boot facility for reading boot code and data from the serial memory in response to a reset of the processor, the serial boot facility comprising:
a pull circuit for causing the input terminal to be set to a first predetermined logic state in response to a read command being provided to the serial memory;
a data out control circuit, coupled to the output terminal, for causing the read command to be provided and for causing a first predetermined number of address bits to be provided to the output terminal; and
a transition detector, coupled to the input terminal, for detecting if the input terminal transitions from the first predetermined logic state to a second predetermined logic state in response to the first predetermined number of address bits;
wherein if the transition detector detects a transition of the input terminal, indicating that the first predetermined number of address bits is a correct number of address bits to access the memory, then receiving the data bits at the input terminal; and
wherein if the transition detector does not detect a transition of the input terminal, indicating that the first predetermined number of address bits is insufficient for accessing the memory, then providing a second predetermined number of address bits to the output terminal.

8. The apparatus of claim 7, wherein the pull circuit comprises a pull-up circuit having a first terminal coupled to a power supply voltage terminal, a second terminal for receiving a control signal, and a third terminal coupled to the input terminal.

9. The apparatus of claim 7, wherein the serial memory is implemented as a standalone monolithic integrated circuit.

10. The apparatus of claim 7, further comprising:
a clock generator for providing a clock signal to the serial memory in response to receiving a system clock signal; and
a divider table, coupled to the clock generator, the divider table comprising a plurality of dividers for reducing a clock rate of the clock signal to substantially match a data rate at which the serial memory can transmit data bits.

11. The apparatus of claim 7, wherein the serial memory comprises memory cells selected from a group consisting of flash, electrically erasable programmable read only memory (EEPROM), ferroelectric random access memory (FRAM), or magnetoresistive random access memory (MRAM) cells.

12. The apparatus of claim 7, further comprising a random access memory coupled to the processor, the random access memory for receiving the boot code and data read from the serial memory.

13. The apparatus of claim 7, wherein the first and second predetermined number of address bits are part of a continuous stream of address bits provided to the output terminal until the transition detector detects a transition on the input terminal.

14. A method for accessing a serial memory comprising:
providing a read command to access the serial memory;
setting an output terminal of the serial memory to a first predetermined logic state using a pull circuit;
providing a first predetermined number of address bits to the serial memory;
monitoring the output terminal to detect when the output terminal transitions from the first predetermined logic state to a second predetermined logic state, and if a transition is detected, indicating that the first predetermined number of address bits is a correct number of address bits for accessing the serial memory, receiving a predetermined number of data bits from the serial memory, and if a transition is not detected, indicating that the serial memory has not received a correct number of address bits, iteratively providing address bits until a transition is detected.

15. The method of claim 14, wherein providing a first predetermined number of address bits further comprises providing a one byte address to the serial memory.

16. The method of claim 14, wherein setting an output of the serial memory to a first predetermined logic state further comprises pulling the output terminal to a logic high state using a pull-up circuit.

17. The method of claim 14, further comprising:
disabling the pull circuit;
providing a predetermined number of clock edges to the serial memory;
receiving a predetermined number of data bits from the serial memory;
determining that all of the predetermined number of data bits have a same logic state; and
reading data from the serial memory.

18. The method of claim 17, further comprising:
determining an output data rate of the serial memory; and
setting a clock rate of an input clock signal provided to the serial memory to substantially match a data rate at which the serial memory can transmit data bits.

19. The method of claim 18, wherein setting a clock rate further comprises setting the clock rate by dividing a system clock rate by a divider selected from a plurality of dividers.

20. The method of claim 14, wherein the serial memory is accessed to provide boot code and data to a processor.

* * * * *